US008692534B2

(12) United States Patent
Trochut

(10) Patent No.: US 8,692,534 B2
(45) Date of Patent: Apr. 8, 2014

(54) CURRENT MEASURING DEVICE

(75) Inventor: Séverin Trochut, Gilly-sur-Isere (FR)

(73) Assignee: ST-Ericsson SA, Plan-les-Ouates (CH)

( * ) Notice: Subject to any disclaimer, the term of this patent is extended or adjusted under 35 U.S.C. 154(b) by 249 days.

(21) Appl. No.: 12/336,518

(22) Filed: Dec. 16, 2008

(65) Prior Publication Data
US 2009/0167261 A1 Jul. 2, 2009

(30) Foreign Application Priority Data

Dec. 17, 2007 (FR) ...................................... 07 59911

(51) Int. Cl.
G05F 1/565 (2006.01)
H02M 3/156 (2006.01)

(52) U.S. Cl.
USPC .......................................... 323/285; 323/271

(58) Field of Classification Search
USPC .......................... 323/271, 275, 282, 285–287
See application file for complete search history.

(56) References Cited

U.S. PATENT DOCUMENTS

| 5,412,309 | A | 5/1995 | Ueunten |
| 6,265,859 | B1 * | 7/2001 | Datar et al. .................... 323/315 |
| 6,323,703 | B1 | 11/2001 | Fotouhi |
| 6,356,065 | B1 * | 3/2002 | Miyazaki ....................... 323/315 |
| 6,377,034 | B1 * | 4/2002 | Ivanov ........................... 323/287 |
| 6,528,976 | B1 | 3/2003 | Lenk et al. |
| 6,700,361 | B2 * | 3/2004 | Gregorius ...................... 323/282 |
| 6,700,365 | B2 | 3/2004 | Isham et al. |
| 7,495,423 | B1 * | 2/2009 | Knight et al. .................. 323/284 |
| 7,683,593 | B2 | 3/2010 | Tao |
| 7,919,952 | B1 * | 4/2011 | Fahrenbruch .................. 323/222 |
| 2002/0158615 | A1 | 10/2002 | Goodfellow et al. |
| 2006/0091872 | A1 | 5/2006 | Matsuura |
| 2006/0097710 | A1 | 5/2006 | Xi |
| 2006/0158158 | A1 * | 7/2006 | Eberlein ........................ 323/222 |
| 2007/0103005 | A1 | 5/2007 | Nagasawa et al. |
| 2007/0263334 | A1 | 11/2007 | Nishida |
| 2008/0111534 | A1 * | 5/2008 | Ravichandran ............... 323/351 |

OTHER PUBLICATIONS

Chen et al (2006) Hysteresis-Current-Controlled Class-D Amplifier with Active Current Sensing Techniques; International Conference on Communications, Circuits and Systems (IEEE); pp. 2737-2740.
Lee et al (2007) High Accuracy CMOS Current Sensing Circuit for Current Mode Control Buck Converter; 7th International Conference on PEDS (IEEE); pp. 44-48.

(Continued)

Primary Examiner — Adolf Berhane
Assistant Examiner — Fred E Finch, III
(74) Attorney, Agent, or Firm — Coats & Bennett, P.L.L.C.

(57) ABSTRACT

An embodiment of a current measuring device, defined by a gain, including an amplification module including an input for receiving a control signal, an input connected to an output node, brought to an output potential and traversed by an output current, a feedback node traversed by a mirror current associated with the output current by a proportionality coefficient equal to the gain, and an output traversed by the mirror current, and capable of bringing the feedback node to the output potential in response to the control signal. The measuring device also includes a gain modification module, mounted between the first potential and the feedback node, including at least one input for receiving an activation signal, and capable of modifying the value of the gain in response to an activation signal.

46 Claims, 2 Drawing Sheets

(56) References Cited

OTHER PUBLICATIONS

Tietze et al. (1991) Electronic Circuits—Design and Applications; Springer-Verlag, Berlin; pp. 332-335.

Preliminary Search Report for French Patent Application Serial No. 0759910 (2008).
Preliminary Search Report for French Patent Application Serial No. 0759911 (2008).

* cited by examiner

CURRENT MEASURING DEVICE

PRIORITY CLAIM

The present application claims the benefit of French Patent Application Serial No. 0759911, filed Dec. 17, 2007, which application is incorporated herein by reference in its entirety.

RELATED APPLICATION DATA

The present application is related to commonly assigned U.S. patent application Ser. No. 12/336,516, filed Dec. 16, 2008, entitled METHOD AND DEVICE FOR MEASURING CURRENT FOR A DC-DC CONVERTER, which application has the same filing date as the present application and is incorporated herein by reference in its entirety.

TECHNICAL FIELD

An embodiment of the disclosure relates in general to the current-mode control at the output of a system supplying a direct-current output voltage predetermined on the basis of a direct-current input voltage (a DC-DC converter).

BACKGROUND

In general, a DC/DC converter converts an available direct-current voltage source, for example delivered by a battery, into a predetermined direct-current output voltage, necessary for supplying a load, in which the direct-current output voltage can be greater than or less than the voltage source.

For example, the DC/DC buck voltage converter shown in FIG. 1, only with the elements necessary for the purpose of understanding being shown, includes a pair of switches mounted between a first potential VBAT, for example a direct-current power supply source, and a second potential GND, for example a ground, and connected to one another by an output node 20. The pair of switches consists, for example, of an upper switch POWER_MOS_1 mounted between the first potential VBAT and the output node 20, and a lower switch POWER_MOS_2 mounted between the output node 20 and the second potential GND. The converter also includes an inductive element L in series with a capacitive element C coupled to a load LOAD and mounted between the output node 20 and the second potential GND. The upper switch POWER_MOS_1 and the lower switch POWER_MOS_2 are, for example, MOS (Metal Oxide Semiconductor) power transistors, with a p-channel and an n-channel, respectively, with low residual resistance (resistance of the transistors when on), and make it possible to alternately connect the inductive element L to the first potential VBAT and to the second potential GND. The output node 20 is thus traversed by an output current IL and set at an output potential VLX By switching the circulation of the output current IL traversing the inductive element L, the DC/DC converter provides, to the connection node VOUT between the inductive element L, the capacitor C and the load LOAD, an output voltage VOUT greater than or less than the voltage source VBAT. We can thus define two modes of operation for this converter: a first mode of operation corresponding, for example, to a drop in the output voltage with respect to the input voltage (buck-mode), and a second mode of operation corresponding, for example, to an increase in the output voltage with respect to the input voltage (boost-mode).

Depending on the voltage and/or current information available at the output of the converter, a control circuit, known to a person skilled in the art and not shown here, delivers and sends a control signal to the gates of the transistors in order to modulate the conduction times of these transistors. The control circuit adjusts a cyclic ratio (i.e., duty cycle) of a control signal sent to each of the top and bottom switches POWER_MOS_1, POWER_MOS_2 so as to keep the value of the output voltage constant. The control signal can, for example, be of the pulse-width-modulation (PWM) type.

To regulate the output voltage of the DC/DC converter, there are two types of regulations:

voltage regulation, also called "voltage-mode control", and current regulation, also called "current-mode control".

Even if the voltage-mode control may be easy to implement, the current-mode control may provide better performance. In the current-mode control, the knowledge of the current information traversing, for example, the inductive element of the converter is necessary.

The prior art discloses a current-measuring device (or current-sense circuit) generating a mirror current proportional to the current traversing the inductive element of the converter. The current-measuring device of the prior art, while providing better control, requires a large bandwidth for the amplification module forming part of the current-measuring device.

However, to ensure good stability of the converter, the bandwidth of the amplification module typically should be increased and the current information typically should be the best possible.

While the converter has a finite bandwidth when it operates according to the second mode of operation and with the current-mode control, even in this configuration, a stability problem may arise. The stability of the converter, therefore, may not be optimal.

Moreover, the current-measuring device of the prior art has a gain of which the value is typically set by the manufacturer. It is, therefore, often not possible to adjust the gain of the current measuring device in order to provide better current information.

In this context, an embodiment of the disclosure is intended to propose a current-measuring device free of at least one of the limitations mentioned above.

SUMMARY

More specifically, an embodiment of the disclosure relates to a current-measuring device, defined by a gain equal to a first value, and including at least one amplification module including at least one input for receiving a control signal, a first input coupled to a first potential, a second input coupled to an output node, brought to an output potential and traversed by an output current; a feedback node traversed by a mirror current associated with the output current by a proportionality coefficient equal to the gain, and an output traversed by the mirror current, in which the amplification module is capable of bringing the feedback node to a potential equal to the output potential in response to the control signal.

An embodiment of the disclosure applies in particular but not exclusively to a linear LDO (Low Dropout) regulator, a direct current-direct current buck or boost voltage converter (or DC/DC converter), or a DC/DC buck-boost voltage converter, of which the principles are known to a person skilled in the art.

Given the finite bandwidth of the amplifier, an embodiment of the disclosure proposes a solution for adjusting the gain of the current copied. An embodiment is intended in particular to improve the stability of the converter by increasing the current information at the output of the current-measuring device, by proposing a current-measuring device with a variable gain.

To this end, the current-measuring device of an embodiment of the disclosure, which is otherwise consistent with the general definition provided in the preamble above, is characterized in that it also includes a gain modification module, mounted between the first potential and the feedback node, and including at least one input for receiving an activation signal, in which said gain-modification module is capable of switching the gain from the first value to a second value greater than the first value in response to an activation signal.

Thus, the current information may be improved owing to the possible adjustment of the value of the gain of the current-measuring device.

The first value may be correlated with a first mode of operation, the second value may be correlated with a second mode of operation, and the activation signal may represent the first or the second mode of operation.

For example, the first mode of operation corresponds to a reduction in the output potential with respect to the first potential.

For example, the second mode of operation corresponds to an increase in the output potential with respect to the first potential.

The value of the gain of the current-measuring device may thus be adjusted so as to provide the best possible compensation according to the configuration in which the converter is working.

For example, the gain-modification module may be a gain switch mounted between the first potential and the feedback node, and may be controlled by the activation signal.

For example, the gain-modification module may be formed by a plurality of gain switches mounted in parallel between the first potential and the feedback node, and controlled by the activation signal.

The value of the gain may thus be defined by selecting a suitable number of gain switches.

According to an embodiment, the output node may be a voltage output of a direct current-direct current buck voltage converter.

According to an embodiment, the output node may be a voltage output of a direct current-direct current boost voltage converter.

According to another embodiment, the output node may be a voltage output of a direct current-direct current buck-boost voltage converter.

According to another embodiment, the output node may be a voltage output of a linear regulator.

The current-measuring device may also include a module for detecting the first or second mode of operation generating the activation signal.

Thus, the value of the gain of the current-measuring device may be adjusted automatically in order to provide the best possible compensation according to the configuration in which the converter is working.

An embodiment of an amplification module includes:

first and second switches coupled to one another by the feedback node, in which the first switch is controlled by the control signal and is mounted between the first potential and the feedback node, and the second switch is mounted between the feedback node and the output, and an amplifier controlling the second switch, and including a positive input coupled to the second input, and a negative input coupled to the feedback node.

An embodiment of the disclosure also relates to a current-measuring process including at least the steps of:

receiving a control signal;

receiving an output potential;

receiving an output current;

generating, at a feedback node, a mirror current associated with the output current by a proportionality coefficient equal to the gain; and generating, at the feedback node, a potential equal to the output potential, in response to the control signal.

The process is characterized in that it also includes steps of:

receiving an activation signal; and modifying the gain in response to the activation signal, causing the gain to switch from a first value to a second value greater than the first value.

The first value may be correlated with a first mode of operation, the second value may be correlated with a second mode of operation, and the activation signal may represent the first or the second mode of operation.

The process may also include a step of detecting the first or the second mode of operation, and a step of generating the activation signal.

An embodiment of the disclosure also relates to a voltage converter including at least the device described above.

BRIEF DESCRIPTION OF THE DRAWINGS

The aforementioned subject matter, features and advantages, as well as others will be described in greater detail in the following description of one or more embodiments of the disclosure, provided in a non-limiting manner in reference to the appended figures, in which.

DETAILED DESCRIPTION

Figure 1:
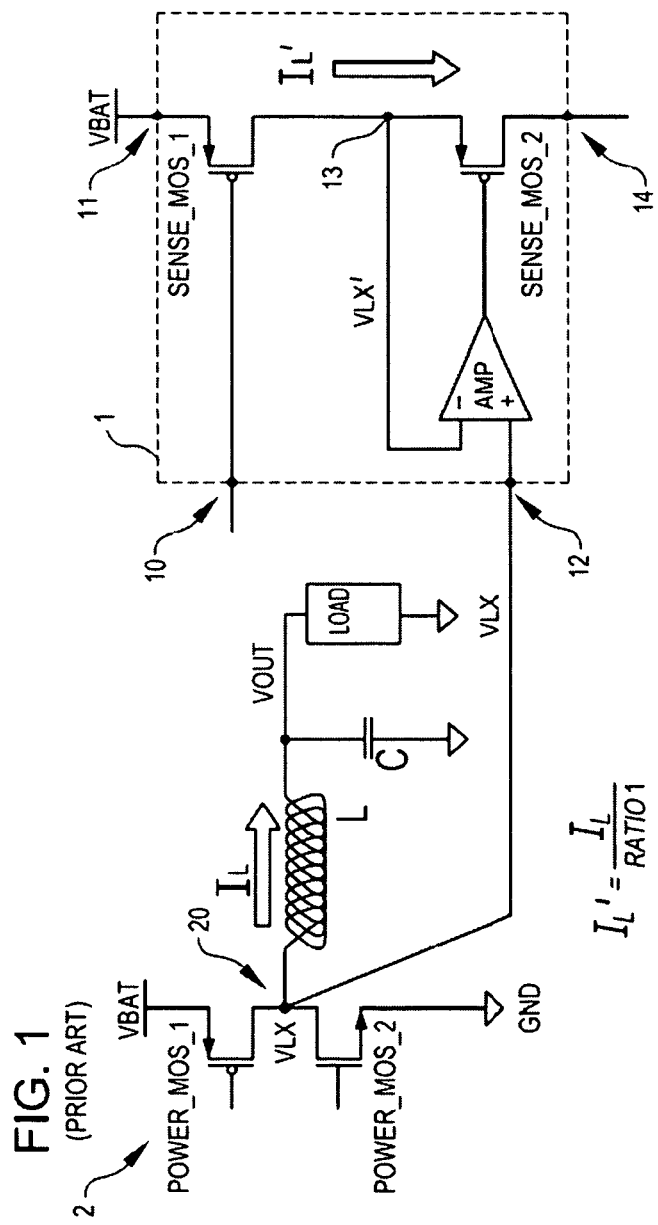
FIG. 1 shows a diagram of a current measuring device known from the prior art coupled to a DC/DC converter.

An example of a current-measuring device (or current-sense circuit) of the prior art is shown in FIG. 1. This current-measuring device, coupled to the converter described above, uses the current-mirror technique. The principle involves copying the output potential VLX present at the output node 20 using a traditional amplifier AMP known to a person skilled in the art, in order to obtain a current proportional to the output current IL, and consequently current information representing the output current IL. This current information is then used, for example, by the control circuit to generate the control signal for regulation.

The current-measuring device includes, for example, an amplification module 1 including, for example, a first switch SENSE_MOS_1 and a second switch SENSE_MOS_2 coupled to one another by a feedback node 13, and mounted in series between the first potential VBAT and an output 14 coupled, for example, to an input of the control circuit. The first switch SENSE_MOS_1 is mounted between the first potential VBAT and the feedback node 13, and the second switch SENSE_MOS_2 is mounted between the feedback node 13 and the output 14. The measuring device also includes an amplifier AMP of which a positive input (or non-inverting input) is, for example, coupled to the output node 20, and a negative input (or inverting input) coupled to the feedback node 13. The first and second switches SENSE_MOS_1, SENSE_MOS_2 are, for example, low-power p-channel MOS transistors with respect to the upper and lower switches POWER_MOS_1, POWER_MOS_2, and are controlled respectively by the control signal and a signal generated at an amplifier output AMP.

In this configuration, the first switch SENSE_MOS_1 and the upper switch POWER_MOS_1 have substantially the same behavior, and the amplifier AMP puts the feedback node 13 at a potential substantially equal to the potential present at the positive input, i.e. the output potential VLX. The amplification module/generates, at the feedback node 13, a mirror current IL' associated with the output current IL by a proportionality coefficient equal to the gain of the current-measuring device. This gain is defined by the inverse of a size ratio existing between the switches of the converter and the switches of the current-measuring device. For example, in the second mode of operation, if there is a first size ratio RATIO1 between the upper switch POWER_MOS_1 and the first switch SENSE_MOS_1, the mirror current IL' is then equal to the ratio of the output current over the first ratio RATIO1, i.e. IL'=IL/RATIO1, and the gain is equal to a first set value (1/RATIO1). This mirror current IL' is then sent to the input of the control circuit, via the second switch SENSE_MOS_2. Depending on the control signal received, the converter can be put in the first or the second mode of operation.

Figure 2:
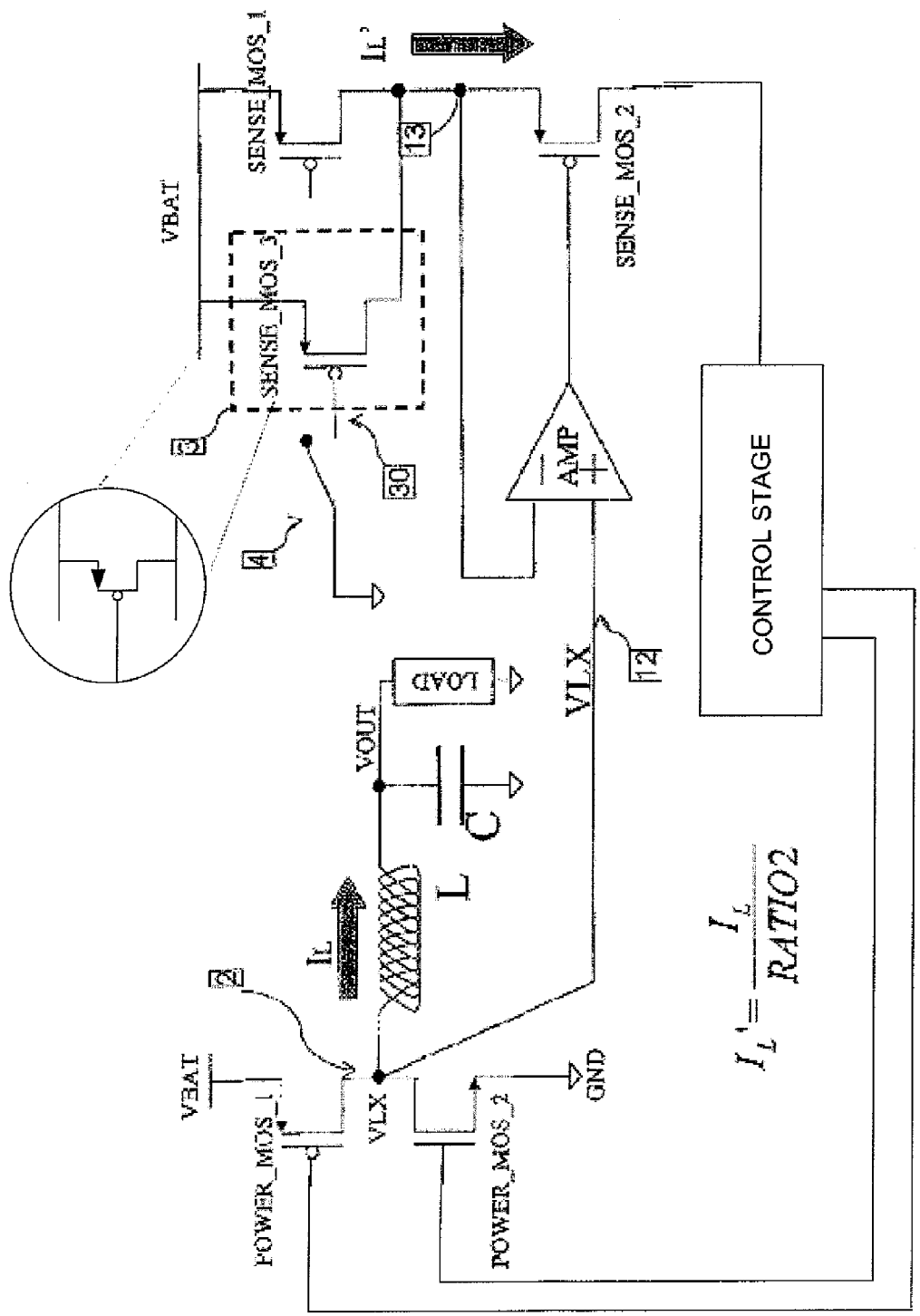
FIG. 2 shows a diagram of a current measuring device according to an embodiment of the disclosure in a specific application, and coupled to the DC/DC Converter of FIG. 1.

FIG. 2 shows a diagram of a current-measuring device according to an embodiment of the disclosure in a specific application and coupled with the DC/DC converter of FIG. 1, which shows, in addition to the elements of the converter and the amplification module already presented above, a gain-modification module 3 mounted between the first potential VBAT and the feedback node 13, and including at least one input 30 for receiving an activation signal, in which the gain-modification module 3 is capable of causing a switch in the gain from the first value to a second value greater than the first value, in response to the activation signal. This gain-modification module may be, for example, a gain switch SENSE_MOS_3, for example a low-power p-channel MOS transistor with respect to the upper switch POWER_MOS_1, and controlled at its gate by the activation signal.

In this configuration, when the converter operates, for example, according to the second mode of operation, and when the gain switch SENSE_MOS_3 is activated, i.e., in conduction, the gain of the current-measuring device is equal to a second value, for example greater than the first value, defined by the inverse of a second size ratio RATIO2 existing between the upper switch POWER_MOS_1 and the assembly formed by the first switch SENSE_MOS_1 and the gain switch SENSE_MOS_3. The mirror current IL' is then increased and is equal to the ratio of the output current over the second ratio RATIO2, i.e. IL'=IL/RATIO2.

Of course, the gain modification module 3 may be formed by a plurality of gain switches controlled by the activation signal, in order to give the gain different values according to the operating conditions of the converter.

The activation signal may be generated by a detection module, represented by the switch 4 in FIG. 2, for example of the second mode of operation, in order to activate, automatically and according to a specific configuration, the gain modification module.

The value of the gain of the current measuring device according to an embodiment of the disclosure may be adjusted according to the mode of operation of the converter, and the stability of the converter coupled with the current-measuring device according to an embodiment of the disclosure may thus be improved, in particular when the converter operates in the second mode of operation.

The description above may apply to a linear regulator and to a direct current-direct current (DC-DC) converter.

The amplification module of FIG. 2 may be part of a power-supply controller which generates the signal(s) that drive(s) the transistors POWER_MOS_1 and POWER_MOS_2 so as to regulate the output voltage VOUT. Some or all of the power-supply controller may be disposed on an integrated circuit (IC). The other portions of the power-supply (e.g., POWER_MOS_1 and POWER_MOS_2) may be disposed on the same IC or external to the IC. Furthermore, the LOAD may be an IC disposed on the same or on a different die relative to the power-supply controller and/or the power supply.

Naturally, in order to satisfy local and specific requirements, a person skilled in the art may apply to the one or more embodiments described above many modifications and alterations. Particularly, although the present disclosure has been described with a certain degree of particularity with reference to described embodiment(s) thereof, it should be understood that various omissions, substitutions and changes in the form and details as well as other embodiments are possible. Moreover, it is expressly intended that specific elements and/or method steps described in connection with any disclosed embodiment of the disclosure may be incorporated in any other embodiment as a general matter of design choice.

The invention claimed is:

1. A current measuring device, defined by a gain equal to a first value, and including at least one amplification module including at least:
    one input for receiving a control signal,
    a first input connected to a first potential,
    a second input connected to an output node, brought to an output potential and traversed by an output current,
    a feedback node traversed by a mirror current associated with the output current by a proportionality coefficient equal to the gain, and
    an output traversed by the mirror current,
    in which the amplification module is capable of bringing the feedback node to a potential equal to the output potential in response to the control signal, and
    a gain modification module, mounted between the first potential and the feedback node, and including at least one input for receiving an activation signal that is related to the control signal, in which said gain modification module is capable of switching the gain from the first value to a second value greater than the first value in response to the activation signal.

2. The device according to claim 1, in which the first value is correlated with a first mode of operation, the second value is correlated with a second mode of operation, and the activation signal represents the first or the second mode of operation.

3. The device according to claim 1, in which the gain modification module is a gain switch mounted between the first potential and the feedback node, and is controlled by the activation signal.

4. The device according to claim 1, in which the gain modification module is formed by a plurality of gain switches mounted in parallel between the first potential and the feedback node, and controlled by the activation signal.

5. The device according to claim 1, in which the output node is a voltage output of a direct current-direct current boost voltage converter.

6. The device according to claim 1, in which the output node is a voltage output of a direct current-direct current buck-boost voltage converter.

7. The device according to claim 1, in which the output node is a voltage output of a linear regulator.

8. The device according to claim 1, in which the current measuring device also includes means for detecting the first or the second mode of operation and generating the activation signal.

9. The device according to claim 1, in which the amplification module includes:
   first and second switches connected to one another by the feedback node, in which the first switch is controlled by the control signal and is mounted between the first potential and the feedback node, and the second switch is mounted between the feedback node and the output, and
   an amplifier controlling the second switch, and including a positive input connected to the second input, and a negative input connected to the feedback node.

10. A current measuring process including at least steps of:
    receiving a control signal;
    receiving an output potential;
    receiving an output potential related to an output current;
    generating, at a feedback node, a mirror current associated with the output current by a proportionality coefficient equal to a gain, the magnitude of the mirror current related to the effective size of at least one switching transistor; and
    generating, at the feedback node, a potential equal to the output potential, in response to a control signal controlling the at least one switching transistor;
    receiving an activation signal related to the control signal; and
    modifying the gain in response to the activation signal, causing the gain to switch from a first value to a second value, by altering the number of switching transistors generating the mirror current.

11. The process according to claim 10, in which the first value is correlated with a first mode of operation, the second value is correlated with a second mode of operation, and the activation signal represents the first or the second mode of operation.

12. The process according to claim 10, in which the process also includes a step of detecting the first or the second mode of operation, and a step of generating the activation signal.

13. The process according to claim 10 wherein modifying the gain in response to the activation signal causes the gain to switch from a first value to a second value greater than the first value.

14. The process according to claim 10 wherein modifying the gain in response to the activation signal causes the gain to switch from a first value to a second value less than the first value.

15. A power supply controller, comprising:
    a first supply node operable to be coupled to an input voltage of the power supply;
    a switching stage configured to be controlled by a control signal;
    a feedback stage having a gain and operable to receive a switching voltage related to the control signal and to generate a feedback signal at a feedback node in response to the switching voltage by switching current from the first supply node through a transistor; and
    a gain adjustment stage connected between the first supply node and the feedback node, and operable to adjust the gain of the feedback stage by altering the effective size of the transistor in response to a gain adjust activation signal related to the feedback signal.

16. The power supply controller of claim 15,
    wherein the feedback stage comprises
    a first switch having a first conduction node coupled to the first supply node, a second conduction node, and a control node operable to be coupled to an input node of the switching stage,
    a second switch having a first conduction node coupled to the second conduction node of the first switch, a second conduction node operable to provide the feedback signal, and a control node, and
    a differential amplifier having a first input node coupled to an output node of the switching stage, a second input coupled to the second conduction node of the first switch, and an output node coupled to the control node of the second switch.

17. The power supply controller of claim 15,
    wherein the feedback stage comprises
    a first transistor having a first conduction node coupled to the first supply node, a second conduction node, and a control node operable to be coupled to an input node of the switching stage,
    a second transistor having a first conduction node coupled to the second conduction node of the first transistor, a second conduction node operable to provide the feedback signal, and a control node, and
    a differential amplifier having a first input node coupled to an output node of the switching stage, a second input node coupled to the second conduction node of the first transistor, and an output node coupled to the control node of the second transistor.

18. The power supply controller of claim 15
    wherein the feedback stage comprises
    a first P channel transistor having a first source drain coupled to the first supply node, a second source drain, and a gate operable to be coupled to an input node of the switching stage,
    a second P channel transistor having a first source drain coupled to the second source drain of the first transistor, a second source drain operable to provide a feedback current as the feedback signal, and a gate, and
    a differential amplifier having a non inverting node coupled to an output node of the switching stage, an inverting input coupled to the second source drain of the first transistor, and an output node coupled to the gate of the second transistor.

19. The power supply controller of claim 15, further comprising:
    wherein the gain stage comprises a switch having a first conduction node coupled to the first supply node, a second conduction node coupled to the feedback stage, and a control node operable to be coupled to an input node of the switching stage.

20. The power supply controller of claim 15, further comprising:
    a second supply node operable to be coupled to a reference voltage of the power supply; and
    wherein the gain stage comprises
    a first switch having a first conduction node coupled to the first supply node, a second conduction node coupled to the feedback stage, and a control node, and
    a second switch having a first conduction node coupled to the control node of the first switch, a second conduction node coupled to the second supply node, and a control node operable to be coupled to an input node of the switching stage.

21. The power supply controller of claim 15, further comprising:
a second supply node operable to be coupled to a reference voltage of the power supply; and
wherein the gain stage comprises
a first switch having a first conduction node coupled to the first supply node, a second conduction node coupled to the feedback stage, and a control node, and
a second switch having a first conduction node coupled to the control node of the first switch, a second conduction node coupled to the second supply node, and a control node operable to receive the gain adjust activation signal.

22. The power supply controller of claim 15,
wherein the gain stage comprises a P-channel transistor having a first source drain coupled to the first supply node, a second source drain coupled to the feedback stage, and a gate operable to be coupled to an input node of the switching stage.

23. The power supply controller of claim 15, further comprising:
a second supply node operable to be coupled to a reference voltage of the power supply; and
wherein the gain stage comprises
a P-channel transistor having a first source-drain coupled to the first supply node, a second source-drain coupled to the feedback stage, and a gate, and
a switch having a first conduction node coupled to the gate of the transistor, a second conduction node coupled to the second supply node, and a control node operable to be coupled to an input node of the switching stage.

24. The power supply controller of claim 15, further comprising:
a second supply node operable to be coupled to a reference voltage of the power supply; and
wherein the gain stage comprises
a P-channel transistor having a first source-drain coupled to the first supply node, a second source-drain coupled to the feedback stage, and a gate, and
a switch having a first conduction node coupled to the gate of the transistor, a second conduction node coupled to the second supply node, and a control node operable to receive a gain adjust activation signal.

25. The power supply controller of claim 15,
wherein the feedback stage comprises
a first transistor having a first conduction node coupled to the first supply node, a second conduction node, and a control node operable to be coupled to an input node of the switching stage,
a second transistor having a first conduction node coupled to the second conduction node of the first transistor, a second conduction node operable to provide a feedback current as the feedback signal, and a control node, and
a differential amplifier having a non inverting node coupled to an output node of the switching stage, an inverting input coupled to the second conduction node of the first transistor, and an output node coupled to the control node of the second transistor; and
wherein the gain stage comprises
a third transistor having a first conduction node coupled to the first supply node, a second conduction node coupled to the second conduction node of the first transistor, and a control node operable to receive a gain adjust activation signal.

26. The power supply controller of claim 15,
wherein the feedback stage comprises
a first P-channel transistor having a first source-drain coupled to the first supply node, a second source-drain, and a gate operable to be coupled to an input node of the switching stage,
a second P-channel transistor having a first source-drain coupled to the second source-drain of the first transistor, a second source drain operable to provide a feedback current as the feedback signal, and a gate, and
a differential amplifier having a non inverting node coupled to an output node of the switching stage, an inverting input coupled to the second source-drain of the first transistor, and an output node coupled to the gate of the second transistor; and
wherein the gain stage comprises
a third P-channel transistor having a first source-drain coupled to the first supply node, a second source-drain coupled to the second source-drain of the first transistor, and a gate operable to receive a gain adjust activation signal.

27. The power supply controller of claim 15,
wherein the feedback stage comprises
a first P-channel transistor having a first source-drain coupled to the first supply node, a second source-drain, and a gate operable to be coupled to an input node of the switching stage,
a second P-channel transistor having a first source-drain coupled to the second source-drain of the first transistor, a second source drain operable to provide a feedback current as the feedback signal, and a gate, and
a differential amplifier having a non inverting node coupled to an output node of the switching stage, an inverting input coupled to the second source-drain of the first transistor, and an output node coupled to the gate of the second transistor; and
wherein the gain stage comprises
a third P-channel transistor having a first source-drain coupled to the first supply node, a second source-drain coupled to the second source-drain of the first transistor, and a gate operable to receive a gain adjust activation signal; and
a fourth P-channel transistor having a first source-drain coupled to the first supply node, a second source-drain coupled to the second source-drain of the first transistor, and a gate operable to receive a gain adjust activation signal.

28. The power supply controller of claim 15, further comprising a control stage coupled to the feedback stage and operable to control the switching stage in response to the feedback signal.

29. A power supply, comprising:
a supply input node;
a supply reference node;
a supply output node;
a filter having an input node and having an output node coupled to the supply output node;
a switching stage coupled between the supply input and reference nodes and operable to alternately couple the input node of the filter to the supply input node and supply reference node in response to a feedback signal, thereby generating an output signal having a first magnitude;
a feedback stage coupled between the supply input node and a feedback node and coupled to the input node of the filter and operable to generate a feedback signal having a second magnitude at the feedback node, the first magnitude related to the second magnitude by a gain; and a gain adjustment stage coupled between the supply input node and the feedback node operable to adjust the gain in response to an activation signal related to the feedback signal.

30. The power supply of claim 29 wherein the filter comprises an inductor.

31. The power supply of claim 29 wherein the filter comprises:
an inductor coupled between the filter input and output nodes; and
a capacitor coupled between the supply output node and the supply reference node.

32. The power supply of claim 29 wherein the switching stage comprises:
a first switch having a first conduction node coupled to the supply input node, a second conduction node coupled to the input node of the filter, and
a control node operable to receive a control signal that is related to the feedback signal; and
a second switch having a first conduction node coupled to the second conduction node of the first switch, a second conduction node coupled to the supply reference node, and a control node coupled to the control node of the first switch.

33. The power supply of claim 29 wherein the switching stage comprises:
a first transistor having a first conduction node coupled to the supply input node, a second conduction node coupled to the input node of the filter, and a control node operable to receive a control signal that is related to the feedback signal; and
a second transistor having a first conduction node coupled to the second conduction node of the first switch, a second conduction node coupled to the supply reference node, and a control node coupled to the control node of the first transistor.

34. The power supply of claim 29 wherein the switching stage comprises:
a P channel first transistor having a first source drain coupled to the supply input node, a second source drain coupled to the input node of the filter, and a gate operable to receive a control signal that is related to the feedback signal; and
an N channel second transistor having a first source drain coupled to the second source drain of the first transistor, a second source drain coupled to the supply reference node, and a gate coupled to the gate of the first transistor.

35. A system, comprising:
a power supply, comprising
a supply input node,
a supply reference node,
a supply output node,
a filter having an input node and having an output node coupled to the supply output node,
a switching stage coupled between the supply input and reference nodes and operable to alternately couple the input node of the filter to the supply input node and supply reference node in response to a feedback signal in a first mode of operation, thereby generating an output signal having a first magnitude;
a feedback stage coupled between the supply input node and a feedback node and coupled to the input node of the filter and operable to generate a feedback signal having a second magnitude at the feedback node, the first magnitude related to the second magnitude by a gain; and
a gain adjustment stage coupled between the supply input node and the feedback node operable to adjust the gain in response to an activation signal related to the feedback signal if the switching stage is in the first mode of operation; and
a load coupled to the supply output node.

36. The system of claim 35 wherein the load comprises an integrated circuit.

37. The system of claim 35 wherein at least a portion of the power supply and a portion of the load are disposed on a same integrated circuit die.

38. The system of claim 35 wherein:
at least a portion of the power supply is disposed on a first integrated circuit die; and
at least a portion of the load is disposed on a second integrated circuit die.

39. A method of controlling a multiple-phase power supply having a power supply phase and a feedback phase, the multiple-phase power supply connected between a first potential and ground and having a gain modification module connected between the first potential and a feedback node, the method comprising:
driving an input node of the power supply phase with a first drive signal that causes a phase current to flow through the phase;
selecting, in the gain modification module, a gain from a plurality of gains, the gain selected by a gain activation signal related to a feedback signal;
generating the feedback signal at the feedback node that substantially equals a mathematical combination of the phase current and the gain; and
controlling the phase current in response to the feedback signal.

40. The method of claim 39 wherein:
the drive signal comprises a drive voltage; and
the feedback signal comprises a feedback current that substantially equals a product of the gain and the phase current.

41. The method of claim 40 wherein a magnitude of the feedback current is smaller than a magnitude of the phase current.

42. The method of claim 39 wherein the gain is less than unity.

43. The method of claim 39 wherein:
selecting the gain comprises identifying a number of transistors; and
generating the feedback signal comprises mirroring the phase current with the identified transistors to generate a feedback current as the feedback signal.

44. The method of claim 39 wherein controlling the phase current comprises alternately driving the input node of the phase with first and second drive voltages in response to the feedback signal, the first drive signal comprising the first drive voltage.

45. The method of claim 39 wherein:
driving the input node of the phase comprises coupling to the input node of the phase as the first drive signal a first drive voltage in response to a control signal;
selecting the gain comprises identifying a number of transistors;
generating the feedback signal comprises driving control nodes of the identified transistors with the control signal to generate a feedback current as the feedback signal; and
controlling the phase current comprises controlling a duty cycle of the control signal in response to the feedback current.

46. The method of claim 39 wherein selecting the gain comprises:
 selecting a first gain for operating a power supply including the phase in a first operating mode; and
 selecting a second gain for operating the power supply in a second operating mode.

\* \* \* \* \*